United States Patent
Yu et al.

(10) Patent No.: US 12,506,476 B2
(45) Date of Patent: Dec. 23, 2025

(54) METHODS AND SYSTEMS OF OPERATING A DOUBLE-SIDED DOUBLE-BASE BIPOLAR JUNCTION TRANSISTOR

(71) Applicant: IDEAL POWER INC., Austin, TX (US)

(72) Inventors: Ruiyang Yu, Austin, TX (US); Mudit Khanna, Austin, TX (US); Jiankang Bu, Austin, TX (US); R. Daniel Brdar, Driftwood, TX (US)

(73) Assignee: IDEAL POWER INC., Austin, TX (US)

( * ) Notice: Subject to any disclaimer, the term of this patent is extended or adjusted under 35 U.S.C. 154(b) by 69 days.

(21) Appl. No.: 18/583,188

(22) Filed: Feb. 21, 2024

(65) Prior Publication Data

US 2025/0266827 A1    Aug. 21, 2025

(51) Int. Cl.
| | |
|---|---|
| *H03K 17/60* | (2006.01) |
| *H03K 17/567* | (2006.01) |
| *H10D 10/40* | (2025.01) |
| *H10D 62/17* | (2025.01) |

(52) U.S. Cl.
CPC ........... *H03K 17/60* (2013.01); *H03K 17/567* (2013.01); *H10D 10/40* (2025.01); *H10D 62/177* (2025.01)

(58) Field of Classification Search
CPC ...... H03K 17/60; H03K 17/567; H10D 10/40; H10D 62/177
See application file for complete search history.

(56) References Cited

U.S. PATENT DOCUMENTS

| | | |
|---|---|---|
| 7,220,661 B1 | 5/2007 | Yu et al. |
| 7,599,196 B2 | 10/2009 | Alexander |
| 7,778,045 B2 | 8/2010 | Alexander |
| 8,295,069 B2 | 10/2012 | Alexander |
| 8,300,426 B2 | 10/2012 | Alexander |
| 8,345,452 B2 | 1/2013 | Alexander |
| 8,391,033 B2 | 3/2013 | Alexander |
| 8,395,910 B2 | 3/2013 | Alexander |
| 8,400,800 B2 | 3/2013 | Alexander |

(Continued)

OTHER PUBLICATIONS

Dong et al., "B-TRAN(TM) Optimization and Performance Characterization", 2023 IEEE Applied Power Electronics Conference and Exposition (APEC), IEEE, Mar. 19, 2023 (Mar. 19, 2023), pp. 1835-1839, XP034351114, [retrieved on May 31, 2023].

(Continued)

*Primary Examiner* — Sibin Chen
(74) *Attorney, Agent, or Firm* — Dickinson Wright PLLC

(57) ABSTRACT

Operating a double-sided double-base bipolar junction transistor. At least one example is a method of operating a switch assembly, the method comprising: conducting a forward load current from an upper terminal of the switch assembly, into an upper collector-emitter of a double-sided double-base bipolar junction transistor (DSDB-BJT), through the DSDB-BJT, out through a lower collector-emitter of the DSDB-BJT, and then through a lower terminal of the switch assembly; and then ceasing conduction of the forward load current. The ceasing conduction of the forward load current may be by: coupling a lower base of the DSDB-BJT to the lower terminal; and driving a pinch-off voltage to the lower collector-emitter of the DSDB-BJT to reduce reverse recovery current through the lower base.

19 Claims, 5 Drawing Sheets

(56) References Cited

U.S. PATENT DOCUMENTS

| | | |
|---|---|---|
| 8,406,025 B1 | 3/2013 | Alexander |
| 8,432,711 B1 | 4/2013 | Alexander |
| 8,441,819 B2 | 5/2013 | Alexander |
| 8,446,042 B2 | 5/2013 | Bundschuh et al. |
| 8,446,745 B1 | 5/2013 | Alexander |
| 8,451,637 B1 | 5/2013 | Alexander |
| 8,461,718 B2 | 6/2013 | Bundschuh et al. |
| 8,471,408 B2 | 6/2013 | Bundschuh et al. |
| 8,514,601 B2 | 8/2013 | Alexander |
| 8,531,858 B2 | 9/2013 | Alexander |
| 9,007,796 B2 | 4/2015 | Alexander |
| 9,029,909 B2 | 5/2015 | Blanchard et al. |
| 9,035,350 B2 | 5/2015 | Blanchard et al. |
| 9,042,131 B2 | 5/2015 | Barron et al. |
| 9,054,706 B2 | 6/2015 | Blanchard et al. |
| 9,054,707 B2 | 6/2015 | Blanchard et al. |
| 9,059,710 B2 | 6/2015 | Blanchard et al. |
| 9,077,185 B2 | 7/2015 | Alexander |
| 9,118,247 B2 | 8/2015 | Alexander |
| 9,130,461 B2 | 9/2015 | Alexander |
| 9,159,819 B2 | 10/2015 | Pfirsch et al. |
| 9,190,894 B2 | 11/2015 | Alexander et al. |
| 9,203,400 B2 | 12/2015 | Alexander et al. |
| 9,203,401 B2 | 12/2015 | Alexander et al. |
| 9,209,713 B2 | 12/2015 | Alexander et al. |
| 9,209,798 B2 | 12/2015 | Alexander et al. |
| 9,231,582 B1 | 1/2016 | Alexander et al. |
| 9,270,142 B2 | 2/2016 | Alexander |
| 9,293,946 B2 | 3/2016 | Alexander |
| 9,337,262 B2 | 5/2016 | Blanchard |
| 9,355,353 B2 | 5/2016 | Von Mueller et al. |
| 9,355,853 B2 | 5/2016 | Blanchard et al. |
| 9,356,595 B2 | 5/2016 | Alexander et al. |
| 9,647,553 B2 | 5/2017 | Alexander et al. |
| 9,742,385 B2 | 8/2017 | Alexander |
| 9,742,395 B2 | 8/2017 | Alexander et al. |
| 9,787,298 B2 | 10/2017 | Alexander et al. |
| 9,799,731 B2* | 10/2017 | Alexander ........... H10D 62/177 |
| 9,818,615 B2 | 11/2017 | Blanchard et al. |
| 9,899,932 B2 | 2/2018 | Alexander |
| 10,056,372 B2 | 8/2018 | Alexander |
| 10,211,283 B2 | 2/2019 | Alexander et al. |
| 10,418,471 B2 | 9/2019 | Alexander et al. |
| 10,497,699 B2 | 12/2019 | Alexander |
| 10,580,885 B1 | 3/2020 | Alexander et al. |
| 10,892,354 B2 | 1/2021 | Alexander et al. |
| 11,069,797 B2 | 7/2021 | Blanchard et al. |
| 11,411,557 B2* | 8/2022 | Mojab .................. H10D 62/133 |
| 11,496,129 B2 | 11/2022 | Mojab |
| 11,522,051 B2 | 12/2022 | Mojab et al. |
| 11,637,016 B2 | 4/2023 | Blanchard et al. |
| 11,699,746 B2 | 7/2023 | Blanchard et al. |
| 11,777,018 B2 | 10/2023 | Blanchard et al. |
| 11,804,835 B2 | 10/2023 | Mojab |
| 11,881,525 B2 | 1/2024 | Bu et al. |
| 11,888,030 B2 | 1/2024 | Wood et al. |
| 2012/0051100 A1 | 3/2012 | Alexander |
| 2012/0279567 A1 | 11/2012 | Alexander |
| 2013/0307336 A1 | 11/2013 | Bundschuh et al. |
| 2013/0314096 A1 | 11/2013 | Bundschuh et al. |
| 2014/0319911 A1 | 10/2014 | Alexander |
| 2015/0061569 A1 | 3/2015 | Alexander et al. |
| 2015/0214782 A1 | 7/2015 | Alexander |
| 2015/0222146 A1 | 8/2015 | Alexander |
| 2015/0222194 A1 | 8/2015 | Bundschuh |
| 2015/0318704 A1 | 11/2015 | Barron et al. |
| 2016/0322350 A1 | 11/2016 | Blanchard |
| 2016/0322484 A1 | 11/2016 | Blanchard |
| 2016/0344300 A1 | 11/2016 | Alexander |
| 2017/0288561 A1 | 10/2017 | Lemberg et al. |
| 2017/0317575 A1 | 11/2017 | Alexander |
| 2018/0026122 A1* | 1/2018 | Blanchard ............ H10D 64/112 257/127 |
| 2018/0109101 A1 | 4/2018 | Alexander |
| 2018/0226254 A1 | 8/2018 | Blanchard et al. |
| 2019/0140548 A1 | 5/2019 | Alexander |
| 2019/0267810 A1 | 8/2019 | Johns |
| 2020/0006945 A1 | 1/2020 | Lemberg et al. |
| 2023/0299188 A1 | 9/2023 | Blanchard et al. |
| 2023/0386987 A1 | 11/2023 | Bu et al. |
| 2024/0396546 A1* | 11/2024 | Khanna ................ H03K 17/567 |

OTHER PUBLICATIONS

Mojab et al., "Operation and Characterization of Low-Loss Bidirectional Bipolar Junction TRANsistor (B-TRAN(TM))", 2022 IEEE Applied Power Electronics Conference and Exposition (APEC), IEEE, Mar. 20, 2022 (Mar. 20, 2022), pp. 205-209, XP034125427, [retrieved on May 19, 2022].

European Patent Office, Search Report and Written Opinion for International Application No. PCT/US2024/059367, Date of Mailing Mar. 28, 2025, 17 pages.

* cited by examiner

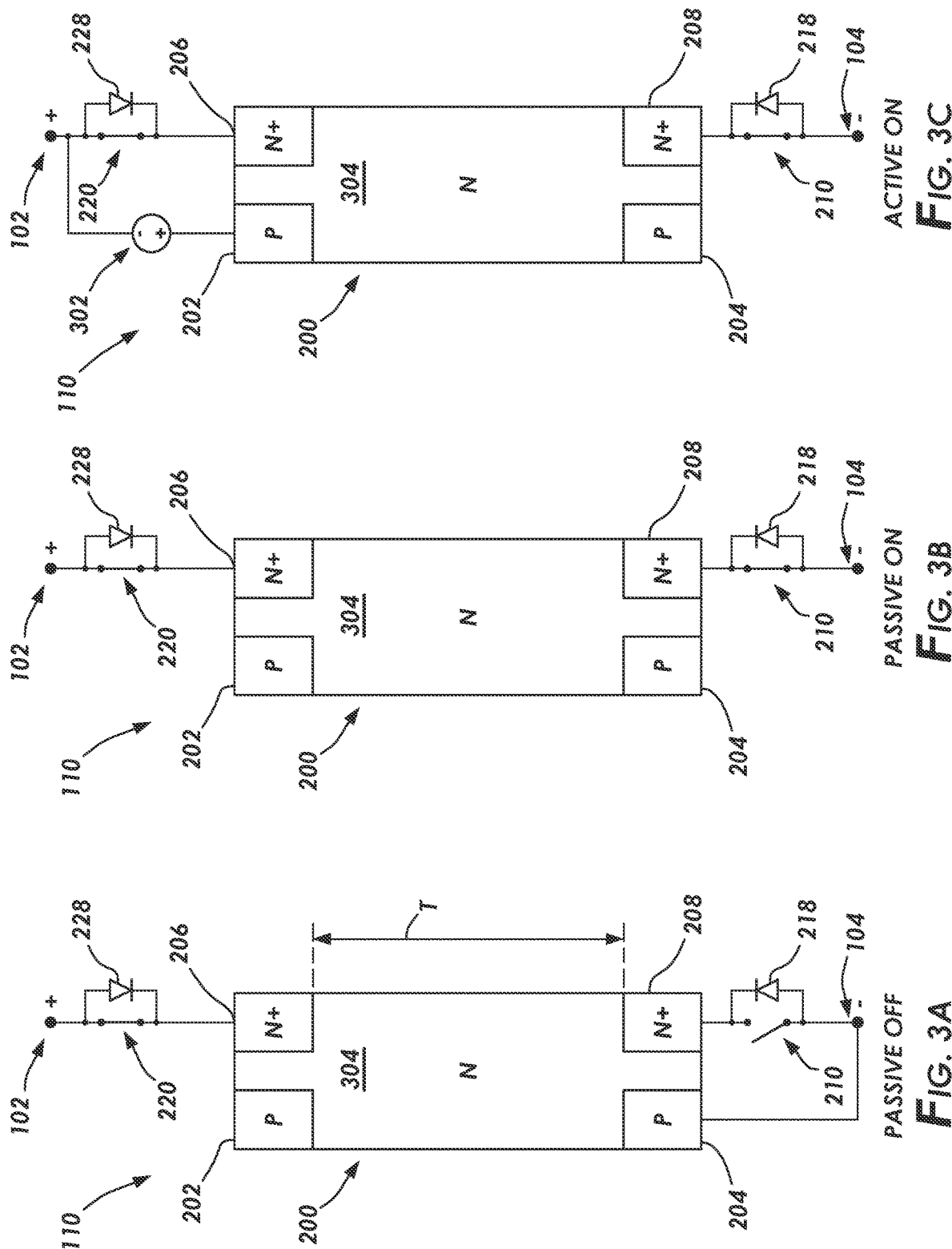

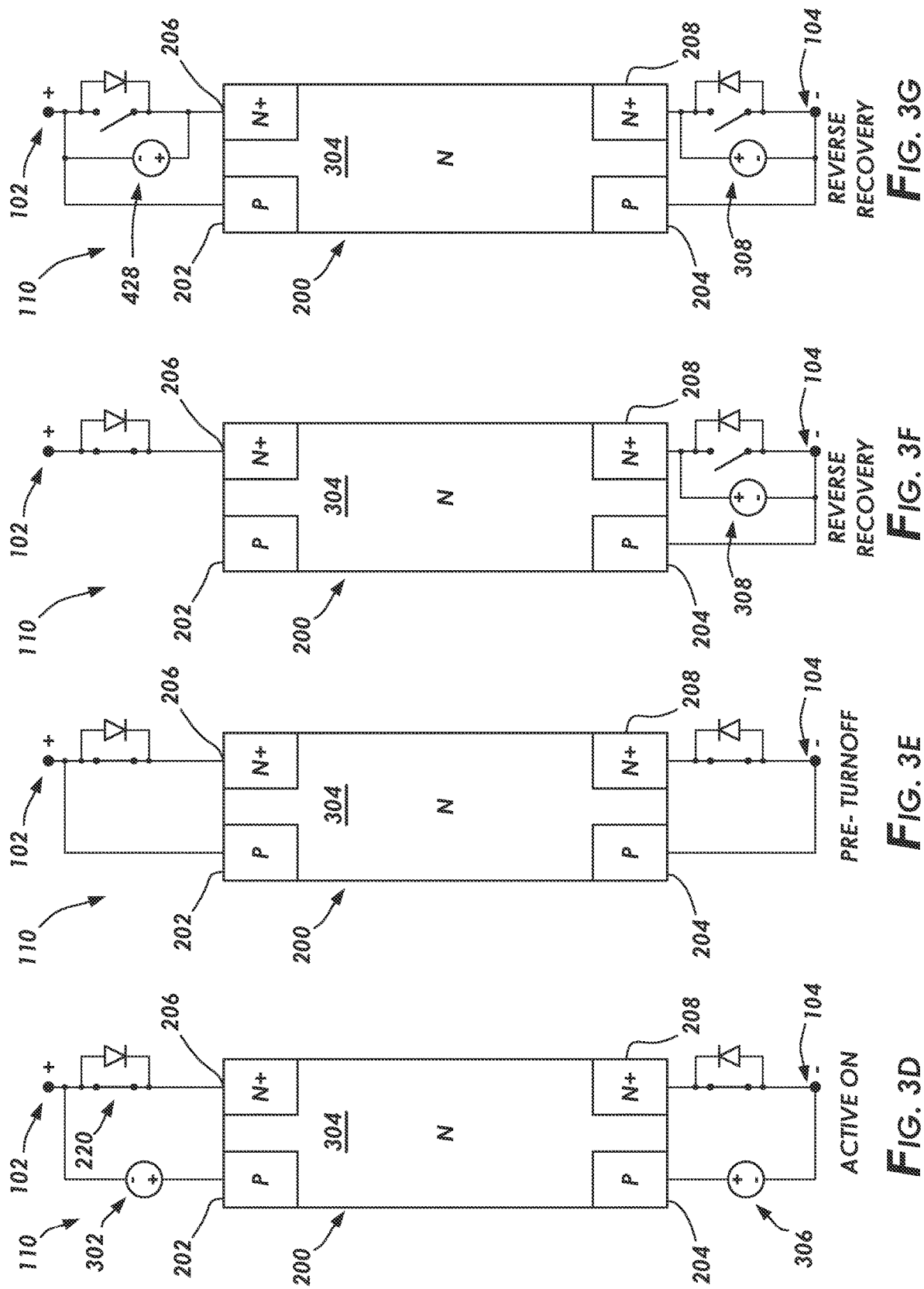

METHODS AND SYSTEMS OF OPERATING A DOUBLE-SIDED DOUBLE-BASE BIPOLAR JUNCTION TRANSISTOR

CROSS-REFERENCE TO RELATED APPLICATIONS

None.

BACKGROUND

A double-sided double-base (DSDB) bipolar junction transistor (BJT) is junction transistor constructed with a base and collector-emitter on a first side of the bulk region, and a distinct and separate base and collector-emitter on a second side of the bulk region, opposite the first side. When properly configured by an external driver, electrical current may selectively flow through the collector-emitters of the DSDB BJT in either direction, and thus such devices are considered bi-directional devices.

SUMMARY

At least one example is a method of operating a switch assembly, the method comprising: conducting a forward load current from an upper terminal of the switch assembly, into an upper collector-emitter of a double-sided double-base bipolar junction transistor (DSDB-BJT), through the DSDB-BJT, out through a lower collector-emitter of the DSDB-BJT, and then through a lower terminal of the switch assembly; and then ceasing conduction of the forward load current. The ceasing conduction of the forward load current may be by: coupling a lower base of the DSDB-BJT to the lower terminal; and driving a pinch-off voltage to the lower collector-emitter of the DSDB-BJT to reduce reverse recovery current through the lower base.

In the example method, driving the pinch-off voltage to the lower collector-emitter may comprise: driving the pinch-off voltage to the lower collector-emitter for a predetermined period of time that is non-zero; and then electrically floating the lower collector-emitter.

In the example method, driving the pinch-off voltage to the lower collector-emitter may comprise: driving the pinch-off voltage to the lower collector-emitter for between and including 200 and 500 nanoseconds; and then electrically floating the lower collector-emitter.

In the example method, driving the pinch-off voltage to the lower collector-emitter may comprise driving the pinch-off voltage of between 10 and 50 Volts, inclusive.

In the example method, driving the pinch-off voltage to the lower collector-emitter may comprises driving the pinch-off voltage of about 30 Volts.

In the example method, conducting main load current may comprises injecting charge carriers into an upper drift region of the DSDB-BJT. Injecting charge carriers into an upper drift region may comprise injecting charge carriers through the upper base of the DSDB-BJT. Conducting main load current may further comprise injecting charge carriers into a lower drift region of the DSDB-BJT. Injecting charge carriers into the lower drift region may comprises injecting charge carriers through the lower base of the DSDB-BJT.

The example method may further comprise: conducting reverse load current from the lower terminal of the switch assembly, into the upper collector-emitter, through the DSDB-BJT, out through the upper collector-emitter, and then through the upper terminal of the switch assembly; and then ceasing conduction of the reverse load current. Ceasing the conduction of reverse load current may be by: coupling the upper base to the upper terminal; and driving a pinch-off voltage to the upper collector-emitter of the DSDB-BJT to reduce reverse recovery current through the upper base.

Yet another example is a switch assembly comprising: an upper terminal, a lower terminal, and a control input; a double-sided double-base bipolar junction transistor (DSDB-BJT) defining an upper base, an upper collector-emitter, a lower base, and a lower collector-emitter; an upper-main FET defining a first lead coupled to the upper terminal, a second lead coupled to the upper collector-emitter, and a gate; a lower-main FET defining a first lead coupled to the lower collector-emitter, a second lead coupled to the lower terminal, and a gate; a driver coupled to the control input, the gate of the upper-main FET, the gate of the lower-main FET, and the upper and lower bases of the DSDB-BJT; responsive to assertion of the control input, and for a first applied voltage across the upper terminal and lower terminal, the driver configured to arrange the DSDB-BJT for conduction of main load current from an upper terminal of the switch assembly, into an upper collector-emitter of the DSDB-BJT, through the DSDB-BJT, out through a lower collector-emitter, and then through the lower terminal of the switch assembly; and responsive to de-assertion of the control input, and for the first applied voltage, the driver configured to cease conduction of the main load current. Ceasing conduction of the main load current may be by: coupling the lower base of the DSDB-BJT to the lower terminal; and driving a pinch-off voltage to the lower collector-emitter to reduce reverse recovery current through the lower base.

In the example switch assembly, when the driver drives the pinch-off voltage to the lower collector-emitter, the driver may be configured to: drive the pinch-off voltage to the lower collector-emitter for a predetermined period of time that is non-zero; and then electrically float the lower collector-emitter.

In the example switch assembly, when the driver drives the pinch-off voltage to the lower collector-emitter, the driver may be configured to: drive the pinch-off voltage to the lower collector-emitter for between and including 200 and 500 nanoseconds; and then electrically float the lower collector-emitter.

In the example switch assembly, when the driver drives the pinch-off voltage to the lower collector-emitter, the driver may be configured to drive the pinch-off voltage of between 10 and 50 Volts, inclusive.

In the example switch assembly, when the driver drives the pinch-off voltage to the lower collector-emitter, the driver may be configured to drive the pinch-off voltage of about 30 Volts.

In the example switch assembly, when the driver arranges the DSDB-BJT for conduction of main load current, the driver may be configured to inject charge carriers into an upper drift region of the DSDB-BJT. When the driver injects charge carriers into the upper drift region, the driver may be configured to inject charge carriers through the upper base of the DSDB-BJT. When the driver arranges the DSDB-BJT for conduction of main load current, the driver may be configured to inject charge carriers into a lower drift region of the DSDB-BJT. When the driver injects charge carriers into the lower drift region, the driver may be configured to inject charge carriers through the lower base of the DSDB-BJT.

BRIEF DESCRIPTION OF THE DRAWINGS

For a detailed description of example embodiments, reference will now be made to the accompanying drawings in which:

FIGS. 3A-3G show a double-sided double-base bipolar junction transistor of PNP construction in shorthand form, with example external electrical connections, to illustrate several operational states;

DEFINITIONS

Figure 1:
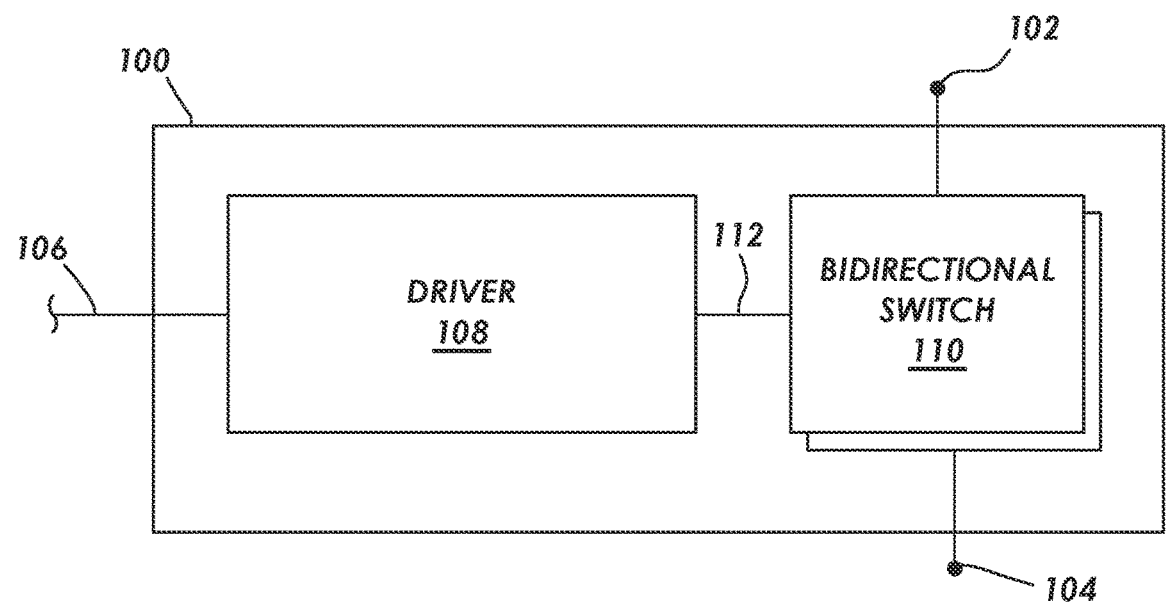
FIG. 1 shows a switch assembly in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or a direct connection. Thus, if a first device couples to a second device, that connection may be through a direct connection or through an indirect connection via other devices and connections.

"A", "an", and "the" as used herein refers to both singular and plural referents unless the context clearly dictates otherwise. By way of example, "a processor" programmed to perform various functions refers to one processor programmed to perform each and every function, or more than one processor collectively programmed to perform each of the various functions. To be clear, an initial reference to "a [referent]", and then a later reference for antecedent basis purposes to "the [referent]", shall not obviate that the recited referent may be plural.

"About" in reference to a recited parameter shall mean the recited parameter plus or minus ten percent (+/−10%) of the recited parameter.

"Assert" shall mean creating or maintaining a first predetermined state of a Boolean signal. Boolean signals may be asserted high or with a higher voltage, and Boolean signals may be asserted low or with a lower voltage, at the discretion of the circuit designer. Similarly, "de-assert" shall mean creating or maintaining a second predetermined state of the Boolean, opposite the asserted state.

"FET" shall mean a field effect transistor, such as a junction-gate FET (JFET) or metal-oxide-silicon FET (MOSFET).

"Closing" in reference to an electrically-controlled switch (e.g., a FET) shall mean making the electrically-controlled switch conductive. For example, closing a FET used as an electrically-controlled switch may mean driving the FET to the fully conductive state.

"Opening" in reference to an electrically-controlled switch (e.g., a FET) shall mean making the electrically-controlled switch non-conductive. Leakage current shall not negate the status of an electrically-controlled switch being non-conductive.

"DSDB-BJT" shall mean a double-sided double-base (DSDB) bipolar junction transistor (BJT) having base and collector-emitter on a first side of a drift region, and a distinct and separate base and collector-emitter on a second side of the drift region, opposite the first side. The drift region may be continuous, or the drift region may comprise an upper drift region associated with the upper base and upper collector-emitter, and a lower drift region associated with the lower base and lower collector-emitter.

"Collector-emitter" of a bipolar junction transistor shall mean a region of the bipolar junction transistor through which main load current flows. For purposes of this specification and claims, the designation as a collector-emitter is independent of the underlying device physics within the bipolar junction transistor. For example, for a double-sided double-base PNP transistor, the main load current may flow from an upper P-type region, through the bulk N-type drift region, and then out the lower P-type region, and when so used the upper P-type region and the lower P-type region are considered collector-emitters. However, in other cases, such as described in co-pending and commonly assigned U.S. application Ser. No. 18/483,939 filed Oct. 10, 2023 and titled "Methods and Systems of Operating a PNP Bi-Directional Double-Base Bipolar Junction Transistor," the main load current may flow from an upper N-type region, through the bulk N-type drift region, and then through the lower N-type region, and when so used the upper and lower N-type regions are considered collector-emitters.

"Base" of a bipolar junction transistor shall mean a region of the bipolar junction transistor through which control current flows, the control current distinct from the main load current. For purposes of this specification and claims, the designation as a base is independent of the underlying device physics within the bipolar junction transistor. For example, for a double-sided double-base PNP transistor, the control current may flow into an upper N-type region or a lower N-type region, and when so used the upper N-type region and the lower N-type region are considered bases. However, in other cases, such as described in co-pending and commonly assigned U.S. application Ser. No. 18/483, 939 noted above, the control current may flow into an upper P-type region or a lower P-type region, and when so used the upper and lower P-type regions are considered bases.

"Upper" in reference to component (e.g., upper collector-emitter, upper base) shall not be read to imply a location of the recited component with respect to gravity. Upper may be derived from location of the device in an example drawing.

"Lower" in reference to a component (e.g., lower collector-emitter, lower base) shall not be read to imply a location of the recited component with respect to gravity. Lower may be derived from location of the device in an example drawing.

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Controller" shall mean, alone or in combination, individual circuit components, an application specific integrated circuit (ASIC), a microcontroller with controlling software, a reduced-instruction-set computing (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to methods and systems of operating a double-sided double-base bipolar junction transistor (DSDB-BJT). More particularly, in the transition from conductive to non-conductive of DSDB-BJT, various examples are directed to driving DSDB-BJTs to reduce reverse recovery current through a blocking PN junction of the DSDB-BJT. The specification turns to an example system to orient the reader.

FIG. 1 shows an example switch assembly 100. In particular, the example switch assembly 100 defines an upper terminal 102, a lower terminal 104, and a control input or control terminal 106. Internally, the example switch assembly 100 includes a driver 108 and a bidirectional switch 110. The driver 108 defines the control terminal 106, and the driver 108 is coupled to the bidirectional switch 110, as shown by connections 112. As discussed in greater detail below, the connections 112, though shown as a single connection, represents a plurality of electrical connections to the bidirectional switch 110 whose conductive state may vary. The driver 108 controls the conductive state of the bidirectional switch 110 by arranging the voltages/currents on the connections 112.

One example of the switch assembly 100 may include a single bidirectional switch 110. Another example switch assembly 100 may have two or more bidirectional switches 110, as illustrated in FIG. 1 by the "stacked" arrangement for the bidirectional switch 110. When multiple bidirectional switches 110 are present, the bidirectional switches 110 are electrically connected in parallel to share the main load current (forward or reverse). So as not to unduly complicate the specification, the discussion that follows assumes a single bidirectional switch 110. However, one having ordinary skill, and with the benefit of this disclosure, understands that the multiple bidirectional switches may be present depending on the designed current carrying capability of any specific switch assembly 100.

Figure 2:
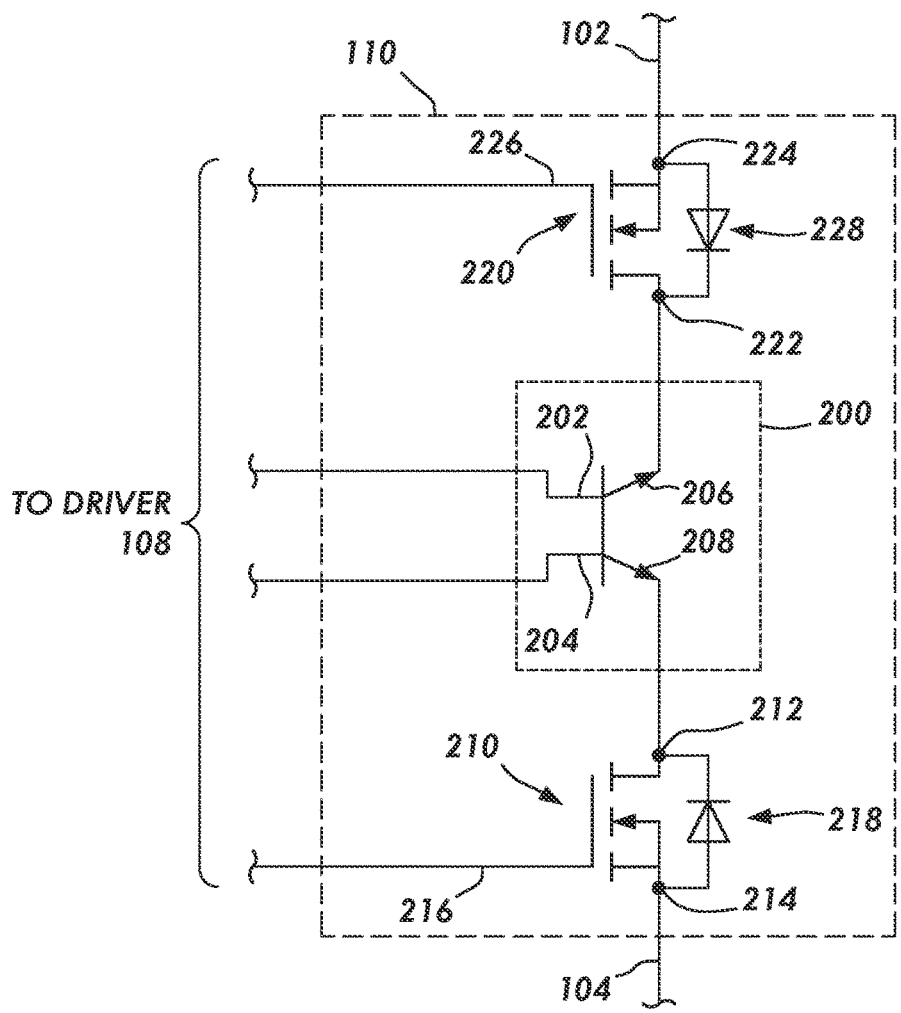
FIG. 2 shows a bidirectional switch in accordance with at least some embodiments.

FIG. 2 shows a schematic of an example bidirectional switch 110. In particular, the example bidirectional switch 110 comprises a DSDB-BJT 200. The example DSDB-BJT 200 defines an upper base 202, a lower base 204, an upper collector-emitter 206, and a lower collector-emitter 208. The example bidirectional switch 110 further includes lower-main or lower cascode FET 210 that defines a drain 212 coupled to the lower collector-emitter 208, a source 214 coupled to the lower terminal 104, a gate 216 coupled to the driver 108, and a body diode 218. Finally, the example bidirectional switch 110 includes an upper-main or upper cascode FET 220 that defines a drain 222 coupled to the upper collector-emitter 206, a source 224 coupled to the upper terminal 102, a gate 226 coupled to the driver 108, and a body diode 228.

The driver 108 is coupled to the bidirectional switch 110 by a plurality of electrical connections. In the example of FIG. 2, the electrical connections to the driver 108 may comprise connections to: the gate 226 of the upper cascode FET 220; the upper collector-emitter 206; the upper base 202; the lower base 204; the lower collector-emitter 208; and the gate 216 of the lower cascode FET 210. In order to describe when each of these connections to the driver 108 may be active, the specification turns to example operation of the DSDB-BJT 200.

FIGS. 3A-3G show, in shorthand form, the bidirectional switch 110. In particular, visible in each of FIGS. 3A-3F are the upper cascode FET 220 and the lower cascode FET 210, along with their respective body diodes 228 and 218. In order to aid in understanding, the cascode FETs 220 and 210 are shown as single pole, single throw switches. When a cascode FET is conductive, the single pole, single throw switch is shown as closed, and when a cascode FET is non-conductive, the single pole, single throw switch is shown as open. Note that, even though a cascode FET may be non-conductive, the body diode of the cascode FET may be conductive depending on the polarity of the voltage applied to the bidirectional switch 110.

The example DSDB-BJT 200 in each of FIGS. 3A-3G is shown as partial cross-sectional view of a device of PNP construction to illustrate several operational states. In particular, FIGS. 3A-3G show seven example states of the DSDB-BJT 200 arranged for the main load current to be carried across or through the N-type regions, the six states being: passive off (FIG. 3A); passive on (FIG. 3B); active on (FIG. 3C); an alternative active on (FIG. 3D); pre-turn off (FIG. 3E); reverse recovery (FIG. 3F); and an alternative reverse recovery (FIG. 3G). In the examples of FIGS. 3A-3G, the switch assembly 100 is assumed to be forward biased (e.g., having the more positive polarity associated with the upper terminal 102 relative to the lower terminal 104) and thus the switch assembly 100 carries a forward load current. Each example state is addressed in turn.

FIG. 3A shows a passive-off arrangement of the example DSDB-BJT 200. In particular, in the example passive-off arrangement the upper base 202 is electrically floated by the driver 108. The upper collector-emitter 206 is coupled to the upper terminal 102 through the upper cascode FET 220 or its body diode 228. The lower base 204 is coupled to the lower terminal 104 by the driver 108. The lower collector-emitter 208 is electrically floated, such as by the lower cascode FET 210 being open and its body diode 218 being non-conductive because of the applied voltage. In the arrangement of FIG. 3A, no appreciable current flows through the DSDB-BJT 200 because of the blocking performed by the PN junction formed between the lower base 204 and the drift region 304. The state of FIG. 3A is referred as "passive off" because the electrical arrangement can be implemented with purely passive components (e.g., diodes and resistors), and thus the driver 108 need not have operational power to implement the arrangement of FIG. 3A. In the passive-off arrangement, the DSDB-BJT 200 blocks voltage and current, and thus the non-conductive lower cascode FET 210 may experience a relatively small drain-to-source voltage (e.g., 30V or less for 1200V applied across the upper terminal 102 and lower terminal 104).

FIG. 3B shows a passive-on arrangement of the example DSDB-BJT 200. In particular, the upper base 202 is electrically floated by the driver 108. The upper collector-emitter 206 is coupled to the upper terminal 102 through the upper cascode FET 220 or its body diode 228. The lower base 204 is electrically floated by the driver 108. The lower collector-emitter 208 is coupled to the lower terminal 104 through lower cascode FET 210. The voltage drop across the DSDB-BJT 200 in the arrangement of FIG. 3B is based on the substrate resistance (e.g., for a 160 micron thick substrate, about 2 ohms). For an example 30 Amps (A) of main load current, in the passive-on arrangement the DSDB-BJT 200 has a voltage drop of about 60V measured from the upper collector-emitter 206 to the lower collector-emitter 208. The example state of FIG. 3B is referred as "passive on" because the conductive state does not involve injection of charge carriers to lower the forward voltage drop $V_{CEON}$. An example of injection of charge carriers is shown in the active-on arrangement of FIG. 3C.

FIG. 3C shows an active-on arrangement of the example DSDB-BJT 200, still with the switch assembly 100 forward biased. In particular, the upper base 202 is coupled, through the driver 108, to the upper terminal 102 by way of a source 302 (e.g., voltage source, current source). The upper collector-emitter 206 is coupled to the upper terminal 102 through the upper cascode FET 220 or its body diode 228. The lower base 204 is electrically floated by the driver 108. The lower collector-emitter 208 is coupled to the lower terminal 104 through the lower cascode FET 210. The source 302 provides a positive bias to the upper base 202 relative to the upper collector-emitter 206, and the source 302 may provide any suitable bias voltage (e.g., 0.2 V to 2V). The source 302 injects charge carriers across the PN junction into the bulk substrate or drift region 304, which lowers forward voltage drop $V_{CEON}$, measured from the upper collector-emitter 206 to the lower collector-emitter 208, to about 0.2V for 30 A of main load current. In particular, the arraignment of FIG. 3C injects charge carriers into the upper portion of the drift region 304.

FIG. 3D shows an alternative active-on arrangement of the example DSDB-BJT 200, still with the switch assembly 100 forward biased. In particular, the upper base 202 is coupled, through the driver 108, to the upper terminal 102 by way of the source 302. The upper collector-emitter 206 is coupled to the upper terminal 102 through the upper cascode FET 220 or its body diode 228. The lower base 204 is coupled, through the driver 108, to the lower terminal 104 by way of a source 306 (e.g., voltage source, current source). The lower collector-emitter 208 is coupled to the lower terminal 104 through the lower cascode FET 210. The source 302 provides a positive bias to the upper base 202 relative to the upper collector-emitter 206, and the source 306 provides a positive bias to the lower base 204 relative to the lower collector-emitter 208. The source 302 injects charge carriers across the upper PN junction into the upper portion of the drift region 304, and the source 306 injects charge carriers across the lower PN junction into the lower portion of the drift region 304. The injection of charge carriers lowers forward voltage drop $V_{CEON}$, measured from the upper collector-emitter 206 to the lower collector-emitter 208, again to about 0.2V for 30 A of main load current.

FIG. 3E shows a pre-turnoff arrangement of the example DSDB-BJT 200. In particular, the upper base 202 is coupled, by way of the driver 108, to the upper terminal 102. The upper collector-emitter 206 is coupled to the upper terminal 102 through the upper cascode FET 220 or its body diode 228. The lower base 204 is coupled, by the driver 108, to the lower terminal 104. The lower collector-emitter 208 is coupled to the lower terminal 104 through the lower cascode FET 210. An equivalent arrangement may be to omit the coupling of the upper base 202 to the upper terminal 102. In the pre-turnoff arrangement of FIG. 3E, the example DSDB-BJT 200 presents about a 2-Ohm resistance across the terminals 102 and 104. Thus, for the example 30 A main load current, in the pre-turn off arrangement of FIG. 3F the DSDB-BJT 200 presents about a 60V drop measured from the upper collector-emitter 206 to the lower collector-emitter 208.

FIG. 3F shows a reverse recovery arrangement of the example DSDB-BJT 200. In particular, the upper collector-emitter 206 is coupled to the upper terminal 102 through the upper cascode FET 220 or its body diode 228. The lower base 204 is coupled, by the driver 108, to the lower terminal 104. The lower collector-emitter 208 is coupled to the lower terminal 104 by way of a source 308 (e.g., voltage source, current source) of the driver 108. The upper base 202 may be electrically floated by the driver 108. The reverse recovery arrangement of FIG. 3F may be used to shorten the diode reverse recovery time of the PN junction formed between the lower base 204 and the drift region 304 after a period of conduction from the upper collector-emitter 206 to the lower collector-emitter 208, as the PN junction formed by the lower base 204 becomes the primary current/voltage blocking mechanism of the DSDB-BJT 200 when the switch assembly 100 is forward biased. That is, the positive voltage between lower collector-emitter 208 and the lower base 204 pinches off N+/P region formed between the lower collector-emitter 208 and the lower base 204, to reduce reverse recovery current between the upper collector-emitter 206 and the lower base 204. Stated otherwise, in the active-on arrangement of FIG. 3C or 3D, excess charge carriers are injected in the drift region to lower the forward voltage drop Vceon. However, in the transition from one of the active-on arrangements to the passive-off arrangement of FIG. 3A, the excess charge carriers create undesirable reverse recovery current ($I_{RR}$) out of the lower base 204, and corresponding increase the reverse recovery time ($T_{RR}$). Implementing the reverse recovery arrangement of FIG. 3F for a non-zero predetermined period of time reduces the reverse recovery current $I_{RR}$ and thus the reverse recovery time $T_{RR}$, compared to implementations that do not implement such a reverse recovery step.

FIG. 3G shows an alternative reverse recovery arrangement of the example DSDB-BJT 200. In particular, the upper collector-emitter 206 is coupled to the upper terminal 102 by way of a voltage source 428, and the upper cascode FET 220 is open. The upper base 202 is coupled, by the driver 108, to the upper terminal 102. The lower base 204 is coupled, by the driver 108, to the lower terminal 104. The lower collector-emitter 208 is coupled to the lower terminal 104 by way of a source 308 (e.g., voltage source, current source) of the driver 108. As with the reverse recovery arrangement of FIG. 3F, the alternative reverse recovery arrangement of FIG. 3G may be used to shorten the diode reverse recovery time of the PN junction formed between the lower base 204 and the drift region 304 after a period of conduction from the upper collector-emitter 206 to the lower collector-emitter 208, as the PN junction formed by the lower base 204 becomes the primary current/voltage blocking mechanism of the DSDB-BJT 200 when the switch assembly 100 is forward biased. That is, the positive voltage between lower collector-emitter 208 and the lower base 204 pinches off N+/P region formed between the lower collector-emitter 208 and the lower base 204, to reduce reverse recovery current between the upper collector-emitter 206 and the lower base 204. Similarly, the positive voltage between upper collector-emitter 2906 and the upper base 202 helps pinch off N+/P region formed between the lower collector-emitter 208 and the lower base 204. Stated otherwise, in the active-on arrangement of FIG. 3C or 3D, excess charge carriers are injected in the drift region to lower the forward voltage drop Vceon. However, in the transition from one of the active-on arrangements to the passive-off arrangement of FIG. 3A, the excess charge carriers create undesirable reverse recovery current ($I_{RR}$) out of the lower base 204, and corresponding increase the reverse recovery time ($T_{RR}$). Implementing the alternative reverse recovery arrangement of FIG. 3G for a non-zero predetermined period of time reduces the reverse recovery current $I_{RR}$ and thus the reverse recovery time $T_{RR}$, compared to implementations that do not implement such a reverse recovery step.

With respect to transitions of the switch assembly 100 from non-conductive to conductive, the example DSDB-BJT 200 may be arranged to transition from the passive-off arrangement of FIG. 3A directly to one of the active-on arrangements of FIG. 3C or 3D without implementing an intermediate arrangement or state. Nevertheless, the passive-on arrangement of FIG. 3B may find use in some circumstances. With the respect to transitions of the switch assembly 100 from conductive to non-conductive, in various examples the DSDB-BJT 200 is transitioned from one of the active-on arrangements of FIG. 3C or 3D to one of the reverse recovery arrangements of FIG. 3F or 3G, in some cases for between and including 200 and 500 nanoseconds, and in a particular case, about 400 nanoseconds. After implementation of either of the reverse recovery arrangements or states, the DSDB-BJT 200 may then be transitioned to the passive-off state of FIG. 3A.

In some cases, such as when the DSDB-BJT 200 is made non-conductive during a zero current event through the switch assembly 100, the reverse recovery arrangement of FIG. 3F or 3G may be omitted, and the DSDB-BJT 200 may be transitioned directly to the passive-off arrangement of FIG. 3A. The pre-turnoff arrangement of FIG. 3E may find use in some circumstances.

The examples of FIGS. 3A-3G are for the switch assembly 100 being forward biased and carrying a forward load current. However, the bidirectional switch 110 is a symmetrical device, and now understanding how to control current through the DSDB-BJT 200 when the switch assembly 100 is forward biased, control of current when the switch assembly 100 is reverse biased (i.e., having the more positive polarity associated with the lower terminal 104 relative to the upper terminal 102) and carrying reverse load current directly follows. It follows, the "forward" and "reverse" terminology is arbitrarily assigned to aid in the description. Moreover, now understanding various operational states of the PNP configuration with main load current flowing through the N-type regions, one of ordinary skill could derive equivalent arrangements for PNP arrangement with main load current flowing through the P-type regions, and for NPN arrangements.

Referring again to FIG. 3A. The example DSDB-BJT 200 is shown as monolithic structure. That is, the upper base 202 and upper collector-emitter 206 are associated with or proximate to an upper portion of the drift region 304. Similarly, the lower base 204 and lower collector-emitter 208 are associated with or proximate to a lower portion of the drift region 304. The example drift region 304 is a continuous structure. The example DSDB-BJT 200 may be manufactured by creating the upper base 202 and upper collector-emitter 206 on an upper side of a wafer. The wafer is then flipped and bonded to a handle wafer, and thereafter the lower base 204 and lower collector-emitter 208 are created on the second side of the wafer. Having a continuous drift region 304 may mean that, for positive polarity on the upper terminal 102, charge carrier injection into the upper base 202 (e.g., FIG. 3C) drops the Vceon sufficiently that charge carrier injection from both sides (e.g., FIG. 3D) provides a small additional benefit. Stated otherwise, for devices in which the drift region 304 is continuous, charge carrier injection into the emitter-base (e.g., FIG. 3C) in many cases provides sufficient Vceon reduction, and the further incremental reduction in forward voltage drop attributable to injecting charge carriers in the collector-base (e.g., FIG. 3D) may not justify the additional components and part counts.

However, in other cases the DSDB-BJTs may be created with non-continuous drift regions. For example, DSDB-BJTs may manufactured by creating a plurality of partial components, such as each partial component comprising a base region, a collector-emitter region, and a drift region. The partial components may be diced or singulated, and then a DSDB-BJT may be created by bonding the drift regions of two partial components. Nevertheless, DSDB-BJTs of with non-contiguous drift regions may be operated according to any of FIGS. 3A-3F, though with non-contiguous drift regions the active-on arrangement of FIG. 3D, injecting charge carriers from both sides of the device, may have benefits over the single-sided injection of charge carriers of FIG. 3E.

In the various examples, the injection of charge carriers may take many forms. In particular, the examples of FIGS. 3C and 3D use voltage sources. In the case of injection from both sides of the device (e.g., FIG. 3D), the voltages may be the same. For example, the voltage provided by the source 302 may be the same as the voltage provided by the source 306. In other cases, the voltages may be different. For example, magnitude of the voltage on the collector-side (e.g., source 302) may be greater than the voltage on the emitter side (e.g., source 306).

In other cases, the injection of charge carriers may be by way of current source(s). In the example of FIG. 3C, the source 302 may provide a setpoint current independent of the voltage used to drive the setpoint current. In the example of FIG. 3D injecting charge carriers from both sides, the magnitude of current supplied to the upper base 202 may be the same as the magnitude of the current supplied to the lower base 204. In other cases, the magnitude of the current supplied to the upper base 202 may be different from the magnitude of control current supplied to the lower base 204. The specification and claims embrace all such variations.

Figure 4:
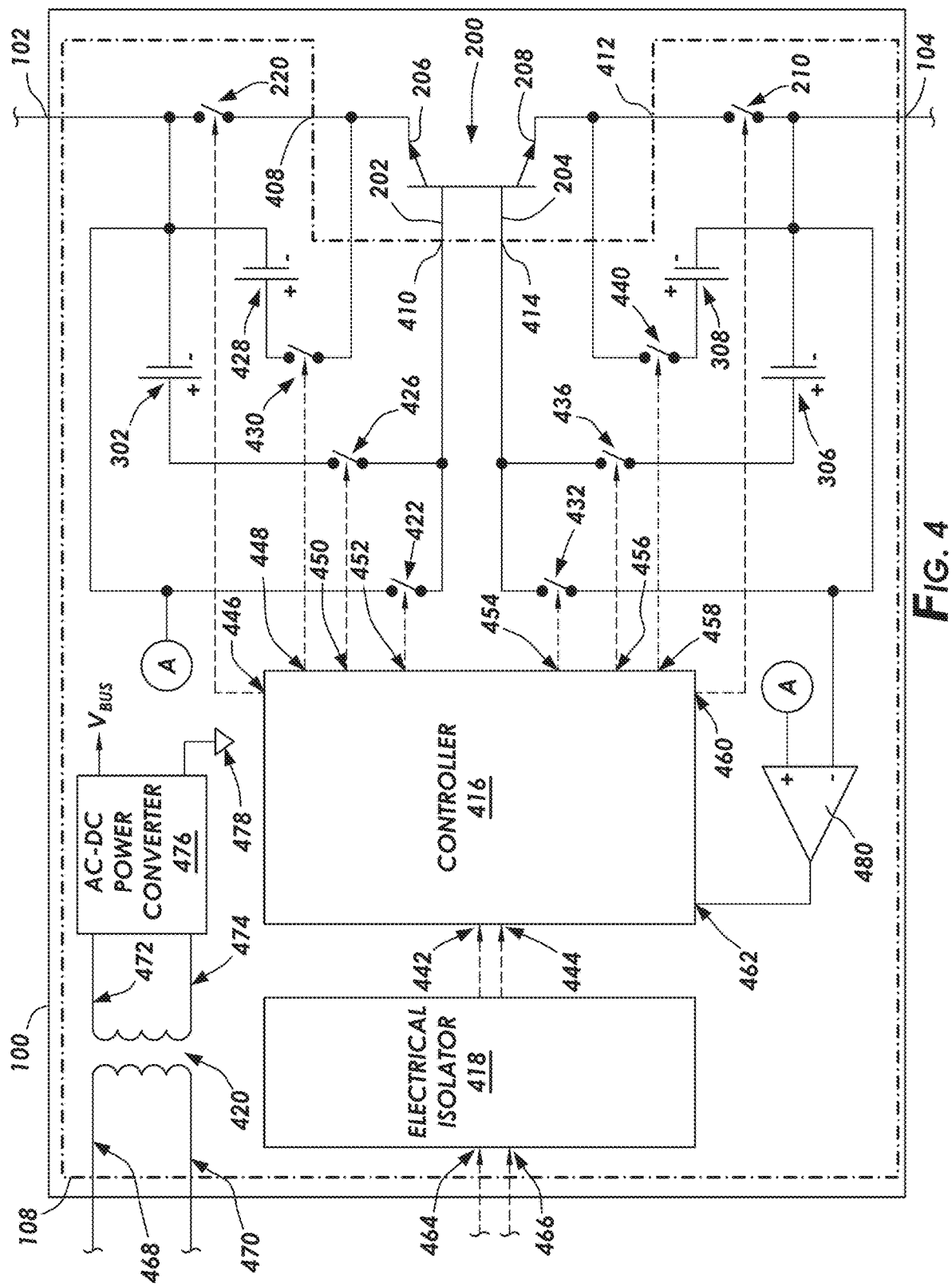
FIG. 4 shows a partial block diagram, partial electrical schematic, of a switch assembly in accordance with at least some embodiments.

FIG. 4 shows a partial block diagram, partial electrical schematic, of an example switch assembly 100. In particular, the example switch assembly 100 comprises the example DSDB-BJT 200 of PNP construction and the driver 108. The DSDB-BJT 200 is shown by way of an example circuit symbol having two emitters and two bases. The circuit symbol shows the upper base 202, the lower base 204, the upper collector-emitter 206, and the lower collector-emitter 208. The example driver 108 defines an upper collector-emitter terminal 408 coupled to the upper collector-emitter 206, an upper conduction terminal 410 coupled to the upper base 204, a lower collector-emitter terminal 412 coupled to the lower collector-emitter 208, and a lower-conduction terminal 414 coupled to the lower base 204.

The example driver 108 comprises a controller 416, an electrical isolator 418, and an isolation transformer 420. In order to place the DSDB-BJT 200 in the various conduction and non-conduction modes, the example driver 108 includes a plurality of electrically-controlled switches and sources of charge carriers. In particular, the example driver 108 comprises a switch 422 that has its first lead coupled to the upper terminal 102, a second lead coupled to the upper base 202, and a control input coupled to the controller 416. The example switch 422 is shown as a single-pole, single-throw switch, but in practice the switch 422 may be a FET with the control input being a gate of the FET. Thus, when the switch 422 is made conductive by assertion of its control input, the upper base 202 is coupled to the upper terminal 102.

The driver 108 further comprises the source 302 illustratively shown as a battery. The source 302 has a negative lead coupled to the upper terminal 102. Another electrically-controlled switch 426 (hereafter just switch 426) has a first lead coupled to the positive terminal of the source 302, a second lead coupled to the upper base 202, and a control input coupled to the controller 416. The example switch 426 is also shown as a single-pole, single-throw switch, but in practice the switch 426 may be a FET with the control input being the gate of the FET. Thus, when the switch 426 is conductive, the source 302 is coupled between the upper terminal 102 and the upper base 202.

The driver 108 further comprises source 428 illustratively shown as a battery. The source 428 has a negative lead coupled to the upper terminal 102. Another electrically-controlled switch 430 (hereafter just switch 430) has a first lead coupled to the positive terminal of the source 428, a second lead coupled to the upper collector-emitter 206, and a control input coupled to the controller 416. The example switch 430 is also shown as a single-pole, single-throw switch, but in practice the switch 430 may be a FET with the control input being the gate of the FET. Thus, when the switches 422 and 430 are conductive, the source 428 is coupled between the upper base 202 and the upper collector-emitter 206 (e.g., reverse recovery for an externally applied voltage more positive at the lower terminal 104, or the alternative reverse recovery for the externally applied voltage more positive on the upper terminal 102).

The driver 108 further comprises the upper cascode FET 220. The upper cascode FET 220 is illustratively shown as a single-pole, single-throw switch. Thus, when the upper cascode FET 220 is made conductive, such as by assertion of its control input, the upper terminal 102 is coupled to the upper collector-emitter 206.

Turning now to lower side of the DSDB-BJT 200, the example driver 108 further comprises a switch 432 that has a first lead coupled to the lower terminal 104, a second lead coupled to the lower base 204, and a control input coupled to the controller 416. The example switch 432 is shown as a single-pole, single-throw switch, but in practice the switch 432 may be a FET with the control input being a gate of the FET. Thus, when the switch 432 is made conductive by assertion of its control input, the lower base 204 is coupled to the lower terminal 104.

The driver 108 further comprises the source 306 illustratively shown as a battery. The source 306 has a negative lead coupled to the lower terminal 104. Another electrically-controlled switch 436 (hereafter just switch 436) has a first lead coupled to the positive terminal of the source 306, a second lead coupled to the lower base 204, and a control input coupled to the controller 416. The example switch 436 is shown as a single-pole, single-throw switch, but in practice the switch 436 may be a FET with the control input being the gate of the FET. Thus, when the switch 436 is conductive, the source 306 is coupled between the lower terminal 104 and the lower base 204.

The example driver 108 further comprises the source 308 illustratively shown as a battery. The source 308 has a negative lead coupled to the lower terminal 104. Another electrically-controlled switch 440 (hereafter just switch 440) has a first lead coupled to the positive terminal of the source 308, a second lead coupled to the lower collector-emitter 208, and a control input coupled to the controller 416. The example switch 440 is shown as a single-pole, single-throw switch, but in practice the switch 440 may be a FET with the control input being the gate of the FET. Thus, when the switches 432 and 440 are conductive, the source 308 is coupled between the lower base 204 and the lower collector-emitter 208 (e.g., reverse recovery shown in FIG. 3F).

The example driver 108 further comprises the lower cascode FET 210. The lower cascode FET 210 is shown as a single-pole, single-throw switch. Thus, when the lower cascode FET 210 is conductive, such as by assertion of its control input, the lower terminal 104 is coupled to the lower collector-emitter.

The controller 416 defines control inputs 442 and 444, and control outputs 446, 448, 450, 452, 454, 456, 458, and 460 coupled to the control inputs of the upper cascode FET 220, switches 430, 426, 422, 432, 436, and 440, and the lower cascode FET 210, respectively. When the control input 442 is asserted, the controller 416 is designed and constructed to arrange the DSDB-BJT 200 for conduction from the upper terminal 102 to the lower terminal 104. Oppositely, when the control input 442 is de-asserted, the controller 416 is designed and constructed to arrange the DSDB-BJT 200 to block current flow from the upper terminal 102 to the lower terminal 104. Similarly, when the control input 444 is asserted, the controller 416 is designed and constructed to arrange the DSDB-BJT 200 for conduction from the lower terminal 104 to the upper terminal 102. Oppositely, when the control input 444 is de-asserted, the controller 416 is designed and constructed to arrange the DSDB-BJT 200 to block current flow from the lower terminal 104 to the upper terminal 102. When the control inputs 442 and 444 are both asserted, the controller 416 arranges the DSDB-BJT 200 for current flow in both directions (e.g., AC breaker service), and when the control inputs 442 and 444 are both de-asserted, the controller 416 blocks current flow in both directions.

The arrangement of the DSDB-BJT 200 to be non-conductive is dependent upon the polarity of the applied voltage. Thus, the example controller 416 may further define a polarity input 462 that receives a Boolean indication of the applied polarity. In the example driver 108, a comparator 480 has a first input coupled to the upper terminal 102 (the connection shown by bubble "A") and a second input coupled to the lower terminal 104. The comparator 480 defines a compare output coupled to the polarity input 462. While FIG. 4 shows the first and second inputs coupled directly to the respective conduction terminals, in practice the voltage across the DSDB-BJT 200 when non-conductive may be large (e.g., 1200V) and thus each of the first and second inputs may be coupled to their respective conduction terminals by way of respective voltage divider circuits. In yet still further cases, the applied polarity may be determined by systems and devices external to the switch assembly 100, and a Boolean signal sent across the electrical isolator 418 to the polarity input 426.

Transitioning the DSDB-BJT 200 from being non-conductive, to conductive, and then back to non-conductive may be a multistep process. To implement the multistep process, the controller 416 may be individual circuit components, an application specific integrated circuit (ASIC), a microcontroller with controlling software, a reduced-instruction-set computing (RISC), a digital signal processor (DSP), a processor with controlling software, a programmable logic device (PLD), a field programmable gate array (FPGA), a programmable system-on-a-chip (PSOC), and/or combinations, configured to read the control inputs 442 and 444, read the polarity input 462, and drive control outputs to implement the mode transitions of the DSDB-BJT 200.

In example systems, the switch assembly 100 is electrically floated. In order to receive the control inputs 442 and 444 in the electrical domain of the switch assembly 100, the example driver 108 implements the electrical isolator 418. The example electrical isolator 418 may take any suitable form, such as optocouplers or capacitive isolation devices. Regardless of the precise nature of the electrical isolator 418, external control signals (e.g., Boolean signals) may be coupled to control inputs 464 and 466 of the electrical isolator 418. Either of the control inputs 464 or 466 may be the control terminal 106 illustratively presented in FIG. 1. The electrical isolator 418, in turn, passes the control signals through to the electrical domain of the switch assembly 100. In the example, the external control signals are passed through to become the control input 442 and 444 of the controller 416.

Turning now to the isolation transformer 420. Various devices within the switch assembly 100 may use operational power. For example, the controller 416 may use a bus voltage and power to enable implementation of the various modes of operation of the DSDB-BJT 200. Further, the sources within system may be implemented as individual voltage sources in the form of switching power converters, or individual current sources also in the form of switching power converters. The switching power converters implementing the sources may use bus voltage and power. In order to provide operational power within the electrical domain of the switch assembly 100, the isolation transformer 420 is provided. External systems (not specifically shown) may provide an alternating current (AC) signal across the primary leads 468 and 470 of the isolation transformer 420 (e.g., 15V AC). The isolation transformer 420 creates an AC voltage on the secondary leads 472 and 474. The AC voltage on the secondary of the isolation transformer 420 may be provided to an AC-DC power converter 476, which rectifies the AC voltage and provides power by way of bus voltage $V_{BUS}$ (e.g., 3.3V, 5V, 12V) with respect to a common 478. The power provided by the AC-DC power converter 476 may be used by the various components of the switch assembly 100. In other cases, multiple isolation transformers may be present (e.g., one for each side of the DSDB-BJT). Further still, a single isolation transformer with multiple secondary windings may be used. The discussion now turns to example arrangements for making the DSDB-BJT 200 conductive and/or non-conductive in the context of the switch assembly 100.

Consider, as an example, a situation in which the applied voltage has the positive polarity on the upper terminal 102. Further consider that the control input 464 applied to the electrical isolator 418 is de-asserted, and thus a control signal applied to the control input 442 of the controller 416 is de-asserted. Based on the de-asserted state of the control input 442, the controller 416 is designed and constructed to place the DSDB-BJT 200 in the non-conductive arrangement taking into account the applied polarity (e.g., as read by the controller 416 through the polarity input 462). Thus, in the example arrangement the upper cascode FET 220 is conductive, the lower cascode FET 210 is non-conductive and the switch 432 is conductive (passive off). In some examples, the upper cascode FET 220 is made conductive by the controller 416 asserting the control output 446. However, in other cases, the body diode of the upper cascode FET 220, and thus the conductivity of upper cascode FET 220, may be based, initially at least, on the applied voltage forward biasing the body diode of the FET. A similar arrangement and/or operation may exist for the lower cascode FET 210 when arranged for blocking current for the opposite polarity.

Still considering the example arrangement of the positive polarity at the upper terminal 102, now consider that the control signal applied to the control input 464 of the electrical isolator 418 is asserted, and thus the control signal applied to the control input 442 of the controller 416 is asserted. Based on the assertion, in the example switch assembly 100 the controller 416 may be designed and constructed to place the DSDB-BJT 200 directly into the active-on arrangement (FIG. 3C). To that end, the controller 416 may assert the control output 446 (if not already asserted) to make the upper cascode FET 220 conductive, assert the control output 450 to make the switch 426 conductive, assert the control output 460 to make the lower cascode FET 210 conductive, and de-assert or leave de-asserted the remaining control outputs. In yet still other cases, to place the DSDB-BJT 200 in the conductive state, the controller 416 may be designed and constructed to make the switch 426 conductive a predetermined period of time prior (e.g., from about 0.1 µs to 5 µs) to making the lower cascode FET 210. Making the switch 426 conductive prior to the making the lower cascode FET 210 conductive may charge the upper collector-emitter 206 to upper base 202 capacitance, making the DSDB-BJT 200 fully conductive more quickly once the lower cascode FET 210 is conductive. In some cases, the controller 416 may be designed and constructed to implement the alternative active-on arrangement of FIG. 3D, and thus controller 416 may also assert the control output 456 to couple the source 306 between the lower terminal 104 and the lower base 204.

Optionally, again with the positive polarity at the upper terminal 102, the controller 416 may be designed and constructed to take the DSDB-BJT 200 through an intermediate conductive arrangement before arriving at the active-on arrangement. For example, the controller 416 may momentarily place the DSDB-BJT 200 in the passive-on arrangement (FIG. 3B). When used, the passive-on arrangement may last a predetermined period (e.g., from about 0.1 µs to 5 µs).

In the active-on arrangement, and for the positive polarity at the upper terminal 102, the source 302 injects charge carriers into the upper base 202. Injecting charge carriers into the upper base 202 increases the number of charge carriers in the drift region of the DSDB-BJT 200, which lowers the $V_{CEON}$ measured across the collector-emitters 206 and 208. In one example, the source 302 injecting charge carriers may lower the $V_{CEON}$ to about 0.2V for about 30 A to 100 A of current flow through the collector-emitters 206 and 208. The source 302 may take any suitable voltage between and including 0.5V and 5.0V, in some cases between 0.6V and 1.5V.

Still referring to FIG. 4, and still considering the positive polarity on the upper terminal 102. Further consider that the control input 464 applied to the electrical isolator 418 transitions from asserted to de-asserted, and thus a control signal applied to the control input 442 of the controller 416 transitions from asserted to de-asserted. Based on the transition, the controller 416 is designed and constructed to place the DSDB-BJT 200 into the reverse recovery arrangement (FIG. 3F). To that end, the controller 416 de-asserts the control output 460 to make the lower cascode FET 210 non-conductive to interrupt the main load current through the DSDB-BJT 200, de-assert the control output 450 to make the switch 426 non-conductive, assert the control output 454 to make the switch 432 conductive to couple the lower base 204 to the lower terminal 104, and assert the control output 458 to make the switch 440 conductive to couple the source 308 between the lower base 204 and the lower collector-emitter 208. As previously mentioned, the reverse recovery arrangement may be implemented for a predetermined period of time, in some cases about 400 nanoseconds. Thereafter, the controller 416 may transition the DSDB-BJT 200 to the passive-off arrange of FIG. 3A.

The example operation discussed with respect to FIG. 4 was with the positive polarity on the upper terminal 102. Again, however, the example DSDB-BJT 200 and the related driver 108 are symmetrical, and now understanding how to arrange the DSDB-BJT 200 into the various conductive and non-conductive states, control of current flow in the opposite direction directly follows.

Figure 5:
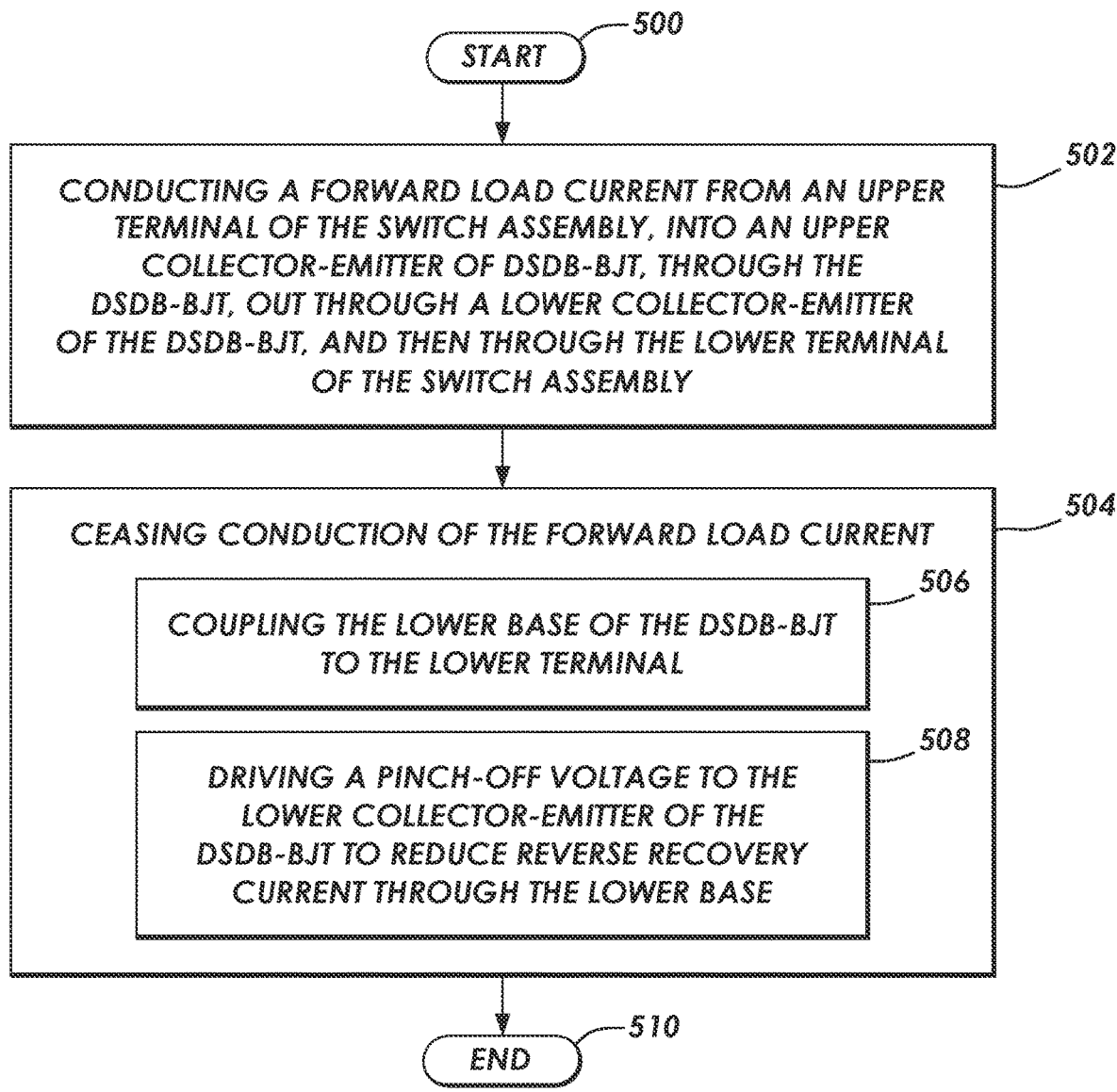
FIG. 5 shows method in accordance with at least some embodiments.

FIG. 5 shows a method of operating a switch assembly in accordance with at least some embodiments. In particular, the method starts (block 500) and comprises: conducting a forward load current from an upper terminal of the switch assembly, into an upper collector-emitter of a DSDB-BJT, through the DSDB-BJT, out through a lower collector-emitter of the DSDB-BJT, and then through the lower terminal of the switch assembly (block 502); and then ceasing conduction of the forward load current (block 504). The ceasing of the forward load current may be by: coupling the lower base of the DSDB-BJT to the lower terminal (block 506); and driving a pinch-off voltage to the lower collector-emitter of the DSDB-BJT to reduce reverse recovery current through the lower base (block 508). Thereafter, the method ends (block 510).

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s). Moreover, this paragraph shall not negate that a base electrically connected to a collector-emitter through a transistor may be referred to as "directly coupled."

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating a switch assembly, the method comprising:
    conducting a forward load current from an upper terminal of the switch assembly, into an upper collector-emitter of a double-sided double-base bipolar junction transistor (DSDB-BJT), through the DSDB-BJT, out through a lower collector-emitter of the DSDB-BJT, and then through a lower terminal of the switch assembly; and then
    ceasing conduction of the forward load current by:
        coupling a lower base of the DSDB-BJT to the lower terminal; and
        driving a pinch-off voltage to the lower collector-emitter of the DSDB-BJT to reduce reverse recovery current through the lower base.

2. The method of claim 1 wherein driving the pinch-off voltage to the lower collector-emitter comprises:
    driving the pinch-off voltage to the lower collector-emitter for a predetermined period of time that is non-zero; and then
    electrically floating the lower collector-emitter.

3. The method of claim 1 wherein driving the pinch-off voltage to the lower collector-emitter comprises:
    driving the pinch-off voltage to the lower collector-emitter for between and including 200 and 500 nanoseconds; and then
    electrically floating the lower collector-emitter.

4. The method of claim 1 wherein driving the pinch-off voltage to the lower collector-emitter comprises driving the pinch-off voltage of between 10 and 50 Volts, inclusive.

5. The method of claim 1 wherein driving the pinch-off voltage to the lower collector-emitter comprises driving the pinch-off voltage of about 30 Volts.

6. The method of claim 1 wherein conducting main load current comprises injecting charge carriers into an upper drift region of the DSDB-BJT.

7. The method of claim 6 wherein injecting charge carriers into an upper drift region comprises injecting charge carriers through the upper base of the DSDB-BJT.

8. The method of claim 6 wherein conducting main load current further comprises injecting charge carriers into a lower drift region of the DSDB-BJT.

9. The method of claim 8 wherein injecting charge carriers into the lower drift region comprises injecting charge carriers through the lower base of the DSDB-BJT.

10. The method of claim 1 further comprising:
    conducting reverse load current from the lower terminal of the switch assembly, into the upper collector-emitter, through the DSDB-BJT, out through the upper collector-emitter, and then through the upper terminal of the switch assembly; and then
    ceasing conduction of the reverse load current by:
        coupling the upper base to the upper terminal; and
        driving a pinch-off voltage to the upper collector-emitter of the DSDB-BJT to reduce reverse recovery current through the upper base.

11. A switch assembly comprising:
    an upper terminal, a lower terminal, and a control input;
    a double-sided double-base bipolar junction transistor (DSDB-BJT) defining an upper base, an upper collector-emitter, a lower base, and a lower collector-emitter;
    an upper-main FET defining a first lead coupled to the upper terminal, a second lead coupled to the upper collector-emitter, and a gate;
    a lower-main FET defining a first lead coupled to the lower collector-emitter, a second lead coupled to the lower terminal, and a gate;
    a driver coupled to the control input, the gate of the upper-main FET, the gate of the lower-main FET, and the upper and lower bases of the DSDB-BJT;
    responsive to assertion of the control input, and for a first applied voltage across the upper terminal and lower terminal, the driver configured to arrange the DSDB-BJT for conduction of main load current from an upper terminal of the switch assembly, into an upper collector-emitter of the DSDB-BJT, through the DSDB-BJT, out through a lower collector-emitter, and then through the lower terminal of the switch assembly; and
    responsive to de-assertion of the control input, and for the first applied voltage, the driver configured to cease conduction of the main load current by:
        coupling the lower base of the DSDB-BJT to the lower terminal; and
        driving a pinch-off voltage to the lower collector-emitter to reduce reverse recovery current through the lower base.

12. The switch assembly of claim 11 wherein when the driver drives the pinch-off voltage to the lower collector-emitter, the driver is configured to:

drive the pinch-off voltage to the lower collector-emitter for a predetermined period of time that is non-zero; and then electrically float the lower collector-emitter.

13. The switch assembly of claim 11 wherein when the driver drives the pinch-off voltage to the lower collector-emitter, the driver is configured to:

drive the pinch-off voltage to the lower collector-emitter for between and including 200 and 500 nanoseconds; and then electrically float the lower collector-emitter.

14. The switch assembly of claim 11 wherein when the driver drives the pinch-off voltage to the lower collector-emitter, the driver is configured to drive the pinch-off voltage of between 10 and 50 Volts, inclusive.

15. The switch assembly of claim 11 wherein when the driver drives the pinch-off voltage to the lower collector-emitter, the driver is configured to drive the pinch-off voltage of about 30 Volts.

16. The switch assembly of claim 11 wherein when the driver arranges the DSDB-BJT for conduction of main load current, the driver is configured to inject charge carriers into an upper drift region of the DSDB-BJT.

17. The switch assembly of claim 16 wherein when the driver injects charge carriers into the upper drift region, the driver is configured to injecting charge carriers through the upper base of the DSDB-BJT.

18. The switch assembly of claim 16 wherein when the driver arranges the DSDB-BJT for conduction of main load current, the driver is configured to inject charge carriers into a lower drift region of the DSDB-BJT.

19. The switch assembly of claim 18 wherein when the driver injects charge carriers into the lower drift region, the driver is configured to inject charge carriers through the lower base of the DSDB-BJT.

* * * * *